United States Patent [19]

Hawrylo

[11] Patent Number: 4,609,139

[45] Date of Patent: Sep. 2, 1986

[54] METHOD OF BURNISHING MALLEABLE FILMS ON SEMICONDUCTOR SUBSTRATES

[75] Inventor: Frank Z. Hawrylo, Hamilton Township, Mercer County, N.J.

[73] Assignee: RCA Corporation, Princeton, N.J.

[21] Appl. No.: 610,016

[22] Filed: May 14, 1984

[51] Int. Cl.⁴ .............................................. B21D 39/00
[52] U.S. Cl. .................................... 228/170; 29/90 R
[58] Field of Search ........................ 29/90 R; 427/289

[56] References Cited

U.S. PATENT DOCUMENTS 3,613,107 10/1971 Cavagnero .
3,676,214 7/1972 English et al. ......................... 51/132
3,883,946 5/1975 Dale .
3,946,334 3/1976 Yonezu et al. .
4,179,852 5/1979 Barnett .................................. 51/132
4,347,486 8/1982 Botez .

Primary Examiner—Frederick R. Schmidt
Assistant Examiner—Maurina Rachuba
Attorney, Agent, or Firm—Birgit E. Morris; Theodore R. Furman

[57] ABSTRACT

An improved burnishing method suitable for planarizing bonding pads on fragile semiconductor devices is disclosed. The method comprises imparting scratches of predetermined depth and spacing onto a glass slide. The bonding pad surface is contacted to the scratched glass surface under a desired pressure and a relative motion is established therebetween. The motion is continued until a smooth, defect-free bonding pad surface has been provided.

7 Claims, 5 Drawing Figures

METHOD OF BURNISHING MALLEABLE FILMS ON SEMICONDUCTOR SUBSTRATES

The Government has rights in this invention pursuant to a government contract.

BACKGROUND OF THE INVENTION

This invention relates to a method of burnishing malleable films on semiconductor substrates and more specifically relates to a method of burnishing bonding pads of gold or gold alloy on semiconductor devices.

It is known to use thermocompression bonding to bond semiconductor devices to headers and heatsinks in the semiconductor art. Often, to facilitate thermocompression bonding, thick metallic films, called bonding pads, are deposited on the surfaces to be joined. The bonding pads are typically of a malleable metal or alloy. When the two bodies are pressed together, the bonding pads compress and are fused by the appropriate combination of temperature, pressure and time. The malleable nature of the pad can also serve to absorb some of the stress of the pressure applied during the process. Thermocompression bonding provides bonding of two objects at a temperature lower than the melting point of the pad material and without the use of a flux.

A problem with bonding small semiconductor devices to heatsinks is the susceptibility of the device to damage or breakage from the pressure applied. For example, electroluminescent devices of gallium arsenide, indium phosphide and the like, because of their inherent strain, can only withstand limited amounts of stress before crystalline damage occurs. Often the pressures required to bond these devices to heatsinks using high-quality gold of gold alloy bonding pads approach the stress limits for the crystalline materials. This damage adversely affects the life of the device.

Even when the bonding is carried out at pressures below the stress limits for a given crystal, damage can result. Misalignment of the device and the heatsink can concentrate all of the pressure in one small area and this point pressure can far exceed the stress limits for the crystalline device. Excessive pressure is also exerted on nodules or high points on the bonding pads.

It therefore becomes important to apply a uniform, parallel pressure to the bonding pads during the bonding process. Providing bonding pads with smooth, defect-free surfaces is the first step towards accomplishing this purpose.

U.S. Pat. No. 3,676,214 to English et al. describes a method which substantially eliminates defects, such as pinholes, in a gold film. The method employs burnishing, which does not scrape or abrade the surface but rather compresses and planarizes the surface to produce a smooth mirror-like finish on the malleable film. The burnishing process can be compared to the effect that a rolling pin has on dough, i.e., the material is leveled by moving it around rather than by removing it. For 5000–40,000 Angstom (hereinafter Å) thick gold films, English et al. suggest vibratory ball burnishing (the vibration of several layers of steel balls on the gold surface) and wire brush burnishing.

Although the bonding pads on semiconductor devices are typically in the 5000–40,000 Å thickness range, the above burnishing methods are not suitable. A typical device is only about 7×12 mils with a bonding pad about the same size thereon. The very size of the device precludes the use of the above burnishing methods. For example, prior art burnishing requires steel balls at least 0.1 millimeter in diameter or about 4 mils. This would provide that only about two balls could fit on the bonding pad surface, and certainly no burnishing would result. The above mentioned methods would also introduce unwanted stress and damage to the fragile semiconductor substrate.

It would be desirable, therefore, to have a method of burnishing bonding pads on semiconductor devices to provide smooth, defect-free surfaces without damaging fragile semiconductor substrates.

SUMMARY OF THE INVENTION

An improved burnishing method suitable for planarizing bonding pads on fragile semiconductor devices is disclosed. The method comprises imparting scratches of predetermined depth and spacing onto a glass slide. The bonding pad surface is contacted to the scratched glass surface under a desired pressure and a relative motion is established therebetween. The motion is contained until a smooth, defect-free bonding pad surface has been provided.

DETAILED DESCRIPTION OF THE INVENTION

Figure 1:
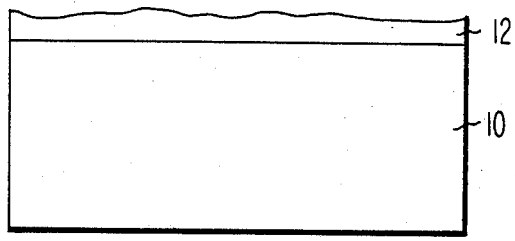
FIG. 1 is a cross-sectional view of a semiconductor device with a non-uniform bonding pad thereon.

The present invention avoids using steel balls or metal bristles required in the prior art methods for burnishing. Unexpectedly, it has been found that a glass slide such as a laboratory microscope slide, or the like, with small scratches on the surface, can effectively burnish a metal or alloy film without damaging the underlying fragile semiconductor substrates. It should be noted that burnishing, unlike polishing or machining, does not remove material to produce a smooth surface. Burnishing is a mechanical process which takes advantage of the malleable nature of a pad or film to compress and planarize the metal or alloy. Burnishing actually moves material from one area to another, much as a rolling pin is used to flatten dough. As such, the burnishing of a malleable material can planarize and fill in defects in the surface. Therefore, burnishing should be distinguished from methods which remove material to provide a smooth surface such as polishing, machining, grinding, and the like. The present invention will now be further described by reference to the Drawing.

Figure 2:
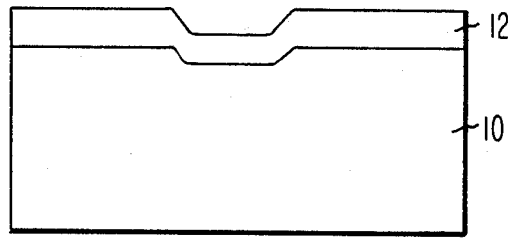
FIG. 2 is a cross-sectional view of a semiconductor device of the oxide defined stripe variety with a conformal bonding pad thereon.
Figure 3:
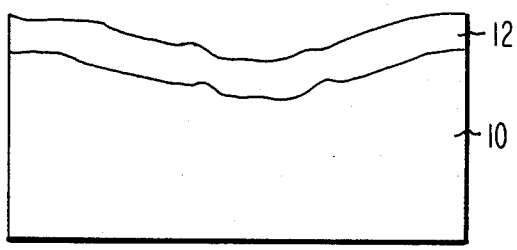
FIG. 3 is a cross-sectional view of a semiconductor device of the non-planar variety with a conformal bonding pad thereon.

FIGS. 1, 2 and 3 are cross-sectional views of semiconductor devices shown as 10, each having a bonding pad 12 thereon. These three FIGURES illustrate three varying types of abnormalities in the bonding films which necessitate a burnishing method such as that of the present invention.

The bonding pad 12 of the semiconductor device 10 of FIG. 1 illustrates surface abnormalities of non-uniform thickness. These abnormalities may just be a result of the deposition method of the bonding pad 12. FIG. 2 illustrates the resultant surface in the bonding pad 12 which comes from the employment of an oxide-defined stripe, as is known in the art, on the semiconductor device 10. The surface irregularity in the bonding pad 12 of FIG. 2 typically measures 700–1400 Å in depth. FIG. 3 illustrates the type of surface abnormality resultant from fabrication of a device on a non-planar substrate such as that described by Botez in U.S. Pat. No. 4,347,486. The depth of the abnormality in the surface of the semiconductor device from FIG. 3 ranges from 1–3 micrometers (hereinafter $\mu m$) averaging 1.5 $\mu m$ in depth. Since effective thermocompression bonding requires a planar surface and since the defects of FIGS. 1, 2 and 3, especially FIGS. 2 and 3, are substantial when considering that the bonding pad 12 is typically 3.5–4.0 $\mu m$ in thickness, it becomes apparent that a high degree of burnishing is necessary to planarize the surface of the bonding pads 12 of the semiconductor devices shown in FIGS. 1 to 3. Further, considering that the typical thickness of the semiconductor device is only about 4 mils of gallium arsenide or indium phosphide or other crystalline material, it becomes further apparent that a sensitive method of burnishing is needed so as to avoid damage to the crystalline substrate.

Figure 4:
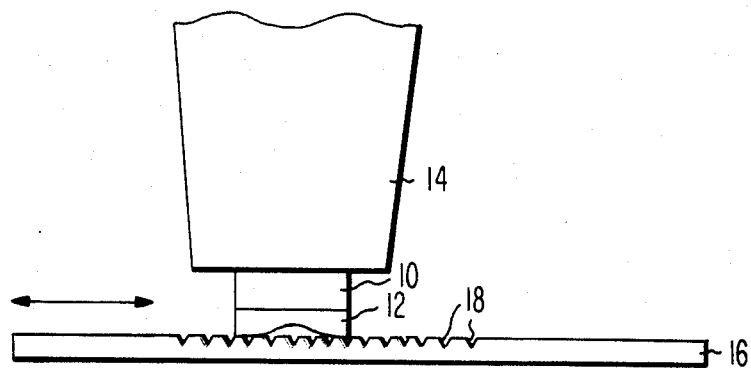
FIG. 4 illustrates the burnishing method of the present invention.

The method of practicing the present invention will be described with reference to FIG. 4. FIG. 4 illustrates an embodiment of the present invention wherein the bonding pad 12 of the device 10 is burnished. A collet 14, which is a device holding tool such as a vacuum chuck, holds the device 10 in contact with a glass slide 16. The glass slide has a series of scratches 18 in its surface. To burnish and planarize the bonding pad 12, the collet 14 holding the device 10 is positioned so as to contact the bonding pad 12 with the scratches 18 under a predetermined pressure. A relative motion is established between the bonding pad 12 and the glass slide 16. The motion can be back and forth or circular but at some point in the process should be perpendicular to linear or channel-like defects in the bonding pad 12.

It should be obvious to those skilled in the art that although bonding pads of varying thicknesses can be burnished by the present method, there is the limitation that the bonding pads must be proportionally thicker as the magnitude of the defect to be corrected increases. Also, according to the present invention, the size and spacing of the scratches and the amount of pressure applied during burnishing are dependent on the magnitude of the defect.

For example, a 7×12 mil 4 mil thick GaAs laser device 10 with an oxide-defined stripe has a cross section as shown in FIG. 2. The bonding pad 12 is typically 3.5–4.0 $\mu m$ thick for thermocompression bonding purposes and the oxide-defined stripe provides a defect on the order of 700–1400 Å in depth.

It has been found that to effectively burnish a bonding pad 12 has described above, the glass slide 16 should have a series of scratches 18 at least about 250 Å deep and spaced about 3–10 mils (75 to 250 $\mu m$), preferably about 5 mils, apart. Any number of scratches 18 can be used but 15–20 scratches have been found to be very effective. For the 700–1400 Å defect in the bonding pad 12 of FIG. 2, a pressure of at least 30 grams or about 785 lbs/in$^2$ (55 Kg/cm$^2$) is needed to help the mechanical process occur. The burnishing process is continued until a flat, defect-free surface on the bonding pad 12 is achieved. Higher pressures and/or deeper scratches 18 can shorten the processing time but chances of damage to the device 10 increase proportionally. Some of the upper limits of these parameters are defined by looking at the burnishing of a device 10 grown by Botez on a non-planar substrate as shown in FIG. 3.

The 3.5 to 4.0 $\mu m$ bonding pad 12 in FIG. 3 typically contains a surface abnormality of about 1.5–2.0 $\mu m$ in depth. Referring again to FIG. 4, the spacing of the scratches 18 in the glass slide 16 is similar to that described above but they may be from about 250 to about 1000 Å deep. The scratches 18 should not exceed 1000 Å in depth because deeper scratches create too much resistance to the burnishing motion, causing damage and stress to the bonding pad 12 and the device 10. Also for the device 10 and bonding pad 12 of FIG. 3, the pressure should be at least 70 grams (about 1800 lbs/in$^2$ or about 125 Kg/cm$^2$) but not greater than 170 grams (4400 lbs/in$^2$ or about 310 Kg/cm$^2$) and preferably about 90 grams (about 2350 lbs/in$^2$ or about 165 Kg/cm$^2$) for the 7×12 mil device.

Figure 5:
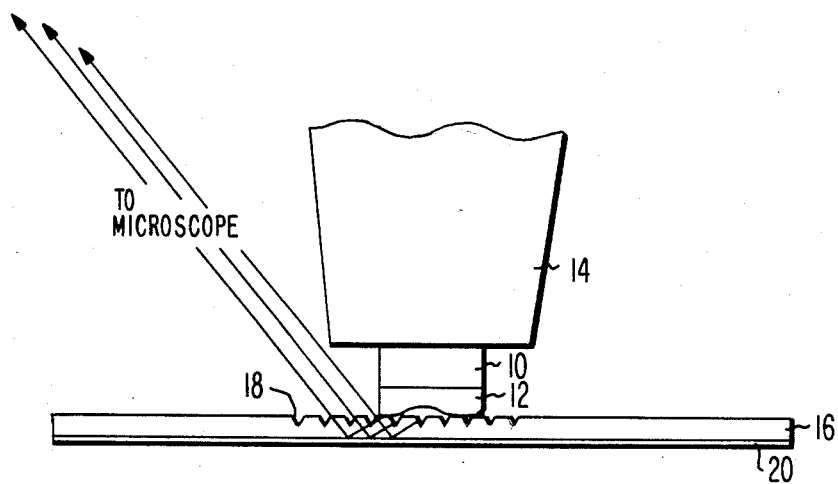
FIG. 5 illustrates another embodiment of the present invention wherein the burnishing process is visually monitored.

It is important to provide that the bonding pad 12 be as smooth as possible while exposing the device 10 to a minimum of stress and damage. Therefore, it is important not to overburnish or underburnish the bonding pad 12, i.e., it is desirable to know exactly when the bonding pad 12 has a satisfactory surface. Since the magnitude of the abnormalities can vary greatly from device to device, monitoring progress of the burnishing is difficult. FIG. 5 illustrates an apparatus for carrying out the present process using a reflective coating 20 on the back of the glass slide 16 which reflects an image of the bonding pad 12, during burnishing up to suitably positioned optics (not shown) and improves monitoring. The reflective coating 20 can be of any material that will reflect light, such as aluminum, or the like.

The burnishing process of the present invention also provides improvement in another area relating to bonding pads. In the fabrication of semiconductor devices, the bonding pads are typically deposited onto a large wafer through a mask. The individual devices are then separated from the wafer, preferably along the edges of the bonding pads. Many times, however, the separation is not exactly along the edge of the pads, leaving a small area on the edges of the device not covered by the bonding pad material. This can cause problems of ineffective dissipation of heat from the device. The mechanical compression and planarizing that takes place on the malleable pad during the burnishing process actually extends the pad towards the edges of the device.

The method of the present invention has been described with respect to malleable films bonding pads on semiconductor substrates. Specifically mentioned are the gold and gold alloy pads commonly used in thermocompression bonding. It should be apparent, however, that the process would be useful for burnishing any malleable film or pad on a fragile substrate.

I claim:

1. A method of burnishing a malleable film on a semiconductor substrate to provide a smooth, defect-free surface comprising:
    imparting scratches of a desired depth and spacing into a first major surface of a smooth glass plate;
    contacting the first major surface of the glass plate to the malleable film and establishing relative motion therebetween;
    continuing said motion under a desired pressure until a defect-free film surface is provided.

2. The method of claim 1 wherein the malleable film is a bonding pad of gold or an alloy thereof.

3. The method of claim 1 wherein a reflective coating is applied to a second major surface of the glass slide opposite the scratches to allow visual observation of the burnishing process.

4. The method of claim 1 wherein the scratches are between about 75 and 250 micrometers apart.

5. The method of claim 1 wherein the scratches are at least 250 Angstroms in depth but not more than 1000 Angstroms in depth.

6. The method of claim 1 wherein between about 55 and 310 kg/cm$^2$ of pressure is applied to the substrate and bonding pad during burnishing.

7. The method of claim 1 wherein the motion is continued to extend the malleable films toward an edge of the substrate.

* * * * *